United States Patent
Yu et al.

(10) Patent No.: US 11,843,029 B2
(45) Date of Patent: Dec. 12, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Youquan Yu, Hefei (CN); Gongyi Wu, Hefei (CN); Shiran Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 148 days.

(21) Appl. No.: 17/502,461

(22) Filed: Oct. 15, 2021

(65) Prior Publication Data

US 2022/0102489 A1    Mar. 31, 2022

Related U.S. Application Data

(63) Continuation of application No. PCT/CN2021/106509, filed on Jul. 15, 2021.

(30) Foreign Application Priority Data

Sep. 28, 2020   (CN) .......................... 202011043756.6

(51) Int. Cl.
*H01L 29/76* (2006.01)
*H01L 29/94* (2006.01)
(Continued)

(52) U.S. Cl.
CPC .... *H01L 29/0649* (2013.01); *H01L 21/76224* (2013.01); *H01L 21/76835* (2013.01);
(Continued)

(58) Field of Classification Search
CPC ........... H01L 29/0649; H01L 21/76224; H01L 21/76835; H01L 21/76843; H01L 21/76229; H10B 12/488; H10B 12/09
(Continued)

(56) References Cited

U.S. PATENT DOCUMENTS 6,509,232 B1    1/2003   Kim et al.
6,531,377 B2    3/2003   Knorr et al.
(Continued)

FOREIGN PATENT DOCUMENTS

CN    102117760 A    7/2011
CN    110911345 A    3/2020

OTHER PUBLICATIONS

International Search Report for International Application PCT/CN2021/106509 dated Sep. 28, 2021.
(Continued)

*Primary Examiner* — Theresa T Doan
(74) *Attorney, Agent, or Firm* — Ladas & Parry LLP (57) ABSTRACT

Embodiments of the present disclosure provide a semiconductor structure and a semiconductor structure manufacturing method. The semiconductor structure includes: a base including an array region and a peripheral region, the peripheral region having a first isolation structure, the array region having a second isolation structure, a top opening area of the first isolation structure being greater than that of the second isolation structure; the first isolation structure having a first groove, and a first insulation structure configured to fill the first groove; and the first insulation structure including at least a top isolation layer, a top surface of the top isolation layer being flush with a top surface of the base, and the top isolation layer being made of at least a low dielectric constant material.

17 Claims, 5 Drawing Sheets

(51) Int. Cl.
*H01L 29/06* (2006.01)
*H01L 21/762* (2006.01)
*H01L 21/768* (2006.01)
*H10B 12/00* (2023.01)

(52) U.S. Cl.
CPC ..... *H01L 21/76843* (2013.01); *H10B 12/488* (2023.02); *H10B 12/09* (2023.02)

(58) Field of Classification Search
USPC ........................................................ 257/370
See application file for complete search history.

(56) References Cited

U.S. PATENT DOCUMENTS

| | | |
|---|---|---|
| 2005/0009293 A1 | 1/2005 | Kim et al. |
| 2012/0168897 A1 | 7/2012 | Ma et al. |
| 2020/0035794 A1 | 1/2020 | Chen et al. |

OTHER PUBLICATIONS

Written Opinion for International Application PCT/CN2021/106509 dated Sep. 28, 2021.

SEMICONDUCTOR STRUCTURE AND MANUFACTURING METHOD THEREOF

CROSS-REFERENCE TO RELATED APPLICATIONS

This application is a continuation of International Patent Application No. PCT/CN2021/106509 filed on Jul. 15, 2021, which claims priority to Chinese Patent Application No. 202011043756.6 filed on Sep. 28, 2020. The above-referenced patent applications are incorporated herein by reference in their entirety.

TECHNICAL FIELD

The present disclosure relates to the field of semiconductors, and in particular, to a semiconductor structure and a semiconductor structure manufacturing method.

BACKGROUND

During the manufacturing of a semiconductor device, an isolation structure is generally used to isolate a number of materials located on a base. The isolation structure is generally a Shallow Trench Isolation (STI) structure.

The shallow trench isolation structure has a trench with a small footprint, which can better adapt to a semiconductor device with a smaller critical dimension. At the same time, the performance of the shallow trench isolation structure is very important for the performance and yield of a finally-formed semiconductor device.

However, when the critical dimension of the semiconductor device is reduced to a 28-nm node and below, it is increasingly difficult to control a contour of the shallow trench isolation structure. For example, when a buried wordline structure is subsequently formed, conventional dry cleaning and wet cleaning may damage the shallow trench isolation structure, which may cause the shallow trench isolation structure to be lower in height than a substrate, may lead to defects such as leakage at an edge of the shallow trench isolation structure, reduces the reliability of the semiconductor device, and then leads to losses of yield and performance of the final device.

SUMMARY

Embodiments of the present disclosure provide a semiconductor structure and a semiconductor structure manufacturing method.

The embodiments of the present disclosure provide a semiconductor structure, including: a base including an array region and a peripheral region, the peripheral region having a first isolation structure, the array region having a second isolation structure, a top opening area of the first isolation structure being greater than that of the second isolation structure; the first isolation structure having a first groove, and a first insulation structure configured to fill the first groove; and the first insulation structure including at least a top isolation layer, a top surface of the top isolation layer being flush with a top surface of the base, and the top isolation layer being made of at least a low dielectric constant material.

The embodiments of the present disclosure further provide a semiconductor structure manufacturing method, including: providing a base, the base including an array region and a peripheral region, the peripheral region having a first isolation structure, the array region having a second isolation structure, a top opening area of the first isolation structure being greater than that of the second isolation structure; removing the first isolation structure with a partial thickness to form a first groove in the peripheral region; and forming a first insulation structure filling the first groove, the first insulation structure including at least a top isolation layer, a top surface of the top isolation layer being flush with a top surface of the base, and the top isolation layer being made of at least a low dielectric constant material.

BRIEF DESCRIPTION OF DRAWINGS

One or more embodiments are exemplarily described by using figures that are corresponding thereto in the accompanying drawings. Unless otherwise particularly stated, the figures in the accompanying drawings do not constitute a scale limitation.

DESCRIPTION OF EMBODIMENTS

When a critical dimension of the semiconductor device is reduced to a 28-nm node and below, it is increasingly difficult to control a contour of a shallow trench isolation structure. For example, when a buried wordline structure is subsequently formed, conventional dry cleaning and wet cleaning may damage the shallow trench isolation structure, which may cause the shallow trench isolation structure to be lower in height than the substrate, may lead to defects such as leakage at an edge of the shallow trench isolation structure, reduces the reliability of the semiconductor device, and then leads to losses of yield and performance of the final device.

A first embodiment of the present disclosure provides a semiconductor structure, including: a base including an array region and a peripheral region, the peripheral region having a first isolation structure, the array region having a second isolation structure, a top opening area of the first isolation structure being greater than that of the second isolation structure; the first isolation structure having a first groove, and a first insulation structure configured to fill the first groove; and the first insulation structure including at least a top isolation layer, a top surface of the top isolation layer being flush with a top surface of the base, and the top isolation layer being made of at least a low dielectric constant material.

In order to make the objectives, technical solutions and advantages of the embodiments of the present disclosure clearer, various embodiments of the present disclosure will be described below in detail with reference to the drawings. However, those of ordinary skill in the art may understand that, in the embodiments of the present disclosure, numerous technical details are set forth in order to enable a reader to better understand the present application. However, the technical solutions claimed in the present application can be implemented without these technical details and various changes and modifications based on the embodiments below. The embodiments below are divided for the convenience of description, and should not constitute any limitation on specific implementation manners of the present disclosure. The embodiments may be combined with each other and mutually referred to without contradiction.

FIG. 1 to FIG. 5 are schematic structural diagrams of a semiconductor structure according to an embodiment of the present disclosure. The semiconductor structure according to this embodiment is specifically described below.

Figure 1:
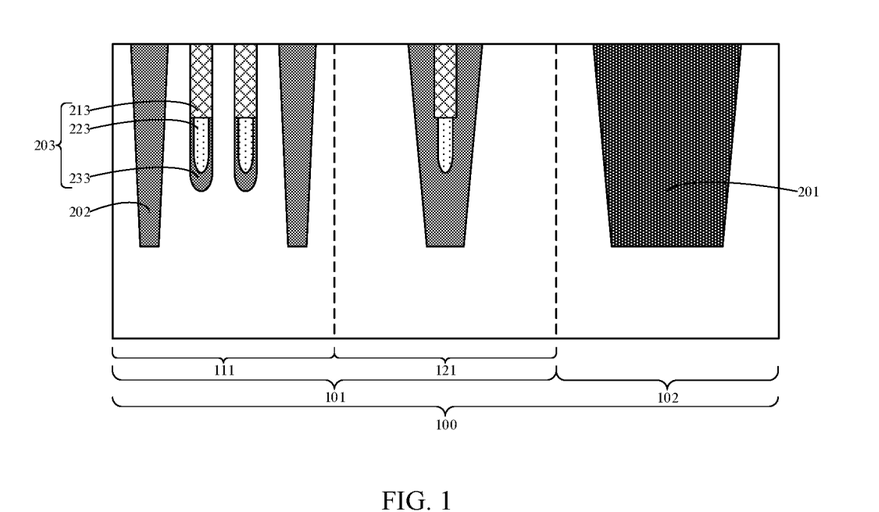
FIG. 1 and FIG. 2 are schematic structural diagrams of a base according to a first embodiment of the present disclosure.

Referring to FIG. 1, a base 100 is provided, including an array region 101 and a peripheral region 102. The peripheral region 102 has a first isolation structure 201, and the array region 101 has a second isolation structure 202. A top opening area of the first isolation structure 201 is greater than that of the second isolation structure 202.

The base 100 may be made of sapphire, silicon, silicon carbide, gallium arsenide, aluminum nitride, zinc oxide or the like. In this embodiment, the base 100 is made of a silicon material. It is clear to those skilled in the art that the base 100 being made of the silicon material in this embodiment is intended to facilitate those skilled in the art to understand the semiconductor structure according to this embodiment, which does not constitute a limitation on this embodiment. During an actual application, a suitable base material may be selected as needed.

In some embodiments, the first isolation structure 201 and the second isolation structure 202 are of a monolayer structure, and the first isolation structure 201 and the second isolation structure 202 are made of silicon oxide. In other embodiments, the first isolation structure and the second isolation structure are made of an insulation material such as silicon nitride, silicon oxynitride or silicon carbide nitride. In addition, in other embodiments, the first isolation structure and the second isolation structure may be of a multilayer structure.

In some embodiments, the array region 101 includes a first array region 111 and a second array region 121. The second isolation structure 202 located in the first array region 111 is separated from a buried wordline structure 203. The buried wordline structure 203 located in the second array region 121 is buried in the second isolation structure 202.

The buried wordline structure 203 separated from the second isolation structure 202 includes: a buried barrier layer 213, a wordline 223 and a wordline isolation layer 233.

In some embodiments, the wordline isolation layer 233 is made of a same material as the first isolation layer 201 and the second isolation layer 202. In other embodiments, the wordline isolation layer may be made of a different insulation material from the first isolation structure and the second isolation structure, such as silicon nitride, silicon oxynitride or silicon carbide nitride.

The wordline 223 is configured to connect a gate of a transistor formed in the array region 101. In this embodiment, the wordline 223 is made of tungsten or a tungsten compound.

The buried barrier layer 213 is configured to bury the wordline 223 in the base 100. In this embodiment, the buried barrier layer 213 is made of silicon nitride. In other embodiments, the buried barrier layer may be made of another insulation material, such as silicon oxide, silicon oxynitride or silicon carbide nitride. In addition, the buried wordline structure 203 formed in the second isolation structure 202 takes the second isolation structure 202 as the wordline isolation layer.

It is to be noted that, in addition to the above structure, the base 100 further includes other structures to ensure normal operation of a subsequently-formed memory. It is clear to those skilled in the art that the above schematic structure is intended to facilitate those skilled in the art to understand the semiconductor structure according to this embodiment, which does not indicate that the base 100 includes only the above structure.

Figure 2:
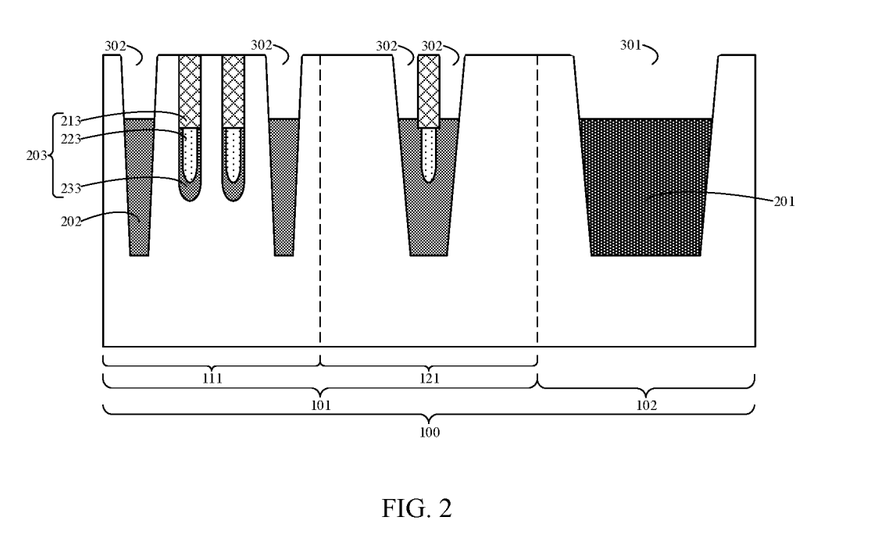

Referring to FIG. 2, the first isolation structure 201 has a first groove 301.

Specifically, the first groove 301 has a depth ranging from 40 nm to 90 nm in a direction perpendicular to a surface of the base 100. In one example, the depth of the first groove 301 may be 50 nm, 60 nm, 70 nm or 80 nm.

Figure 3:
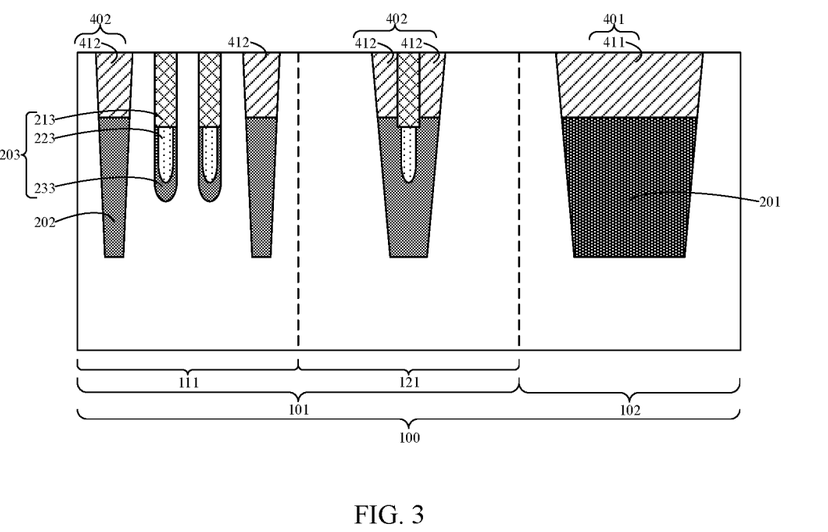
FIG. 3 is a first schematic structural diagram of a semiconductor structure according to the first embodiment of the present disclosure.
Figure 4:
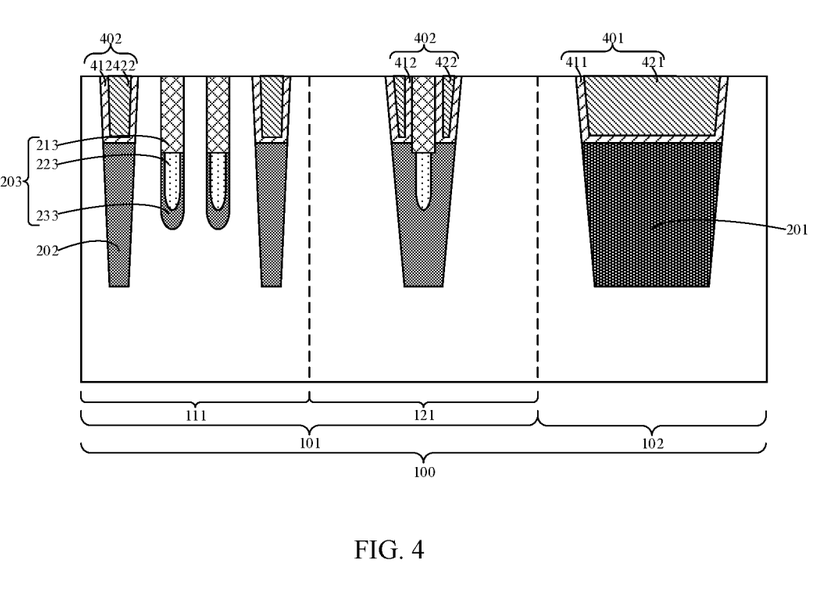
FIG. 4 is a second schematic structural diagram of the semiconductor structure according to the first embodiment of the present disclosure.
Figure 5:
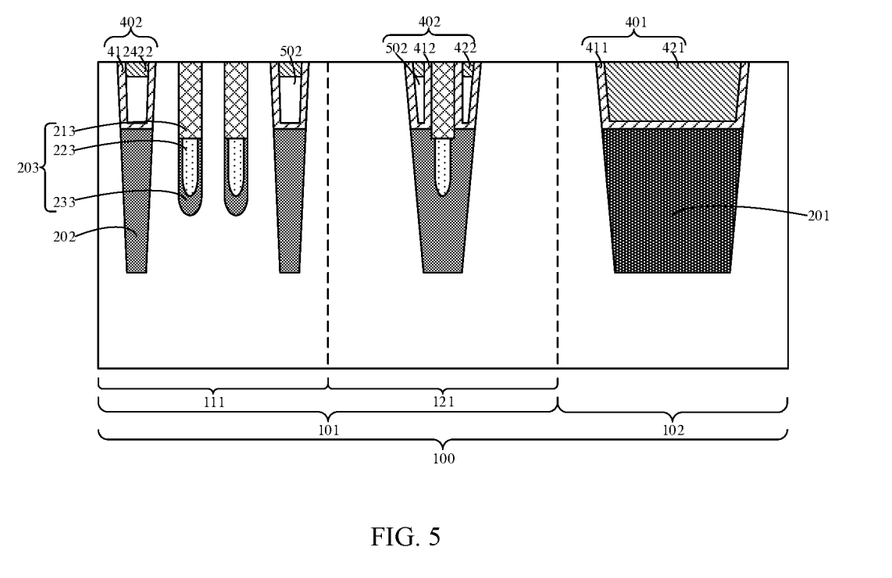
FIG. 5 is a third schematic structural diagram of the semiconductor structure according to the first embodiment of the present disclosure.

Referring to FIG. 3 to FIG. 5, a first insulation structure 401 is configured to fill the first groove 301.

The first insulation structure 401 includes at least a top isolation layer 411, a top surface of the top isolation layer 411 is flush with a top surface of the base 100, and the top isolation layer 411 is made of at least a low dielectric constant material. The top isolation layer 411 is made of the low dielectric constant material, so as to improve an isolation effect of the shallow trench isolation structure in the peripheral region 102.

In some embodiments, the top isolation layer 411 is made of at least one or more of silicon oxynitride, silicon oxycarbonitride, silicon boron nitride, silicon boron oxynitride and silicon carbide nitride. Silicon oxynitride, silicon oxycarbonitride, silicon boron nitride, silicon boron oxynitride and silicon carbide nitride have strong corrosion resistance. The top isolation layer 411 is formed by a low dielectric constant material with strong corrosion resistance to prevent damages to the first insulation structure 401 formed in the subsequent process.

Specific structures of two first insulation structures 401 are given in this embodiment. The two different first insulation structures 401 are specifically introduced below with reference to the accompanying drawings.

In the first structure, referring to FIG. 3, the first insulation structure 401 is of a monolayer structure; that is, the top isolation layer 411 fills the first groove 301 to form the first insulation structure 401.

In the second structure, referring to FIG. 4 and FIG. 5, the first insulation structure 401 further includes a bottom isolation layer 421; the bottom isolation layer 421 is located on a top surface of the first groove 301 and located on a bottom surface of the top isolation layer 411.

In some embodiments, the bottom isolation layer 421 is located on a sidewall and a top surface of the first groove 301, and the top isolation layer 411 is configured to fill the remaining first groove 301 covered by the bottom isolation layer 421.

The bottom isolation layer 421 may be made of a same material as the top isolation layer 411, and the bottom isolation layer 421 may be made of a different material from the top isolation layer 411. In this embodiment, the bottom isolation layer 421 is made of a different material from the top isolation layer 411. An interface layer of the shallow trench isolation structure in the peripheral region 102 is further increased through a multilayer structure, which helps improve dielectric properties of the shallow trench isolation structure in the peripheral region 102.

Specifically, the bottom isolation layer 421 is made of at least one or more of silicon oxynitride, silicon oxycarbonitride, silicon boron nitride, silicon boron oxynitride and silicon carbide nitride. In this embodiment, the bottom isolation layer 421 has a thickness ranging from 3 nm to 5 nm, which may specifically be 3.5 nm, 4.0 nm or 4.5 nm.

It is to be noted that, in other embodiments, the thickness of the bottom isolation layer may be increased appropriately to increase an aspect ratio of the first groove. A groove with a larger aspect ratio is easier to seal. A first air gap exists between the top isolation layer and the bottom isolation layer that are formed by sealing treatment. With the first insulation structure having the first air gap, the dielectric properties of the shallow trench isolation structure in the peripheral region can be further improved.

Referring to FIG. 2, in this embodiment, the second isolation structure 202 has a second groove 302.

Specifically, the second groove 302 has a depth ranging from 30 nm to 70 nm in the direction perpendicular to the surface of the base 100. In one example, the depth of the second groove 302 may be 40 nm, 50 nm or 60 nm.

Referring to FIG. 3 to FIG. 5, in this embodiment, a second insulation structure 402 configured to fill the second groove 302 is further included.

The second insulation structure 402 includes at least a top insulation layer 412, a top surface of the top insulation layer 412 is flush with a top surface of the base 100, and the top insulation layer 412 is made of at least a low dielectric constant material. The top insulation layer 412 is made of the low dielectric constant material, so as to improve an isolation effect of the shallow trench isolation structure in the array region 101.

In some embodiments, the top insulation layer 412 is made of at least one or more of silicon oxynitride, silicon oxycarbonitride, silicon boron nitride, silicon boron oxynitride and silicon carbide nitride. Silicon oxynitride, silicon oxycarbonitride, silicon boron nitride, silicon boron oxynitride and silicon carbide nitride have strong corrosion resistance. The top insulation layer 412 is formed by a low dielectric constant material with strong corrosion resistance to prevent damages to the second insulation structure 402 formed in the subsequent process. Moreover, in this embodiment, the top insulation layer 412 is made of a same material as the top isolation layer 411.

Specific structures of three second insulation structures 402 are given in this embodiment. The three different second insulation structures 402 are specifically introduced below with reference to the accompanying drawings.

In the first structure, referring to FIG. 3, the second insulation structure 402 is of a monolayer structure; that is, the top insulation layer 412 fills the second groove 302 to form the second insulation structure 402.

In the second structure, referring to FIG. 4, the second insulation structure 402 further includes a bottom insulation layer 422; the bottom insulation layer 422 is located on a top surface of the second groove 302 and located on a bottom surface of the top insulation layer 412.

In some embodiments, the bottom insulation layer 422 is located on a sidewall and a top surface of the second groove 302, and the top insulation layer 412 is configured to fill the remaining second groove 302 covered by the bottom insulation layer 422.

The bottom insulation layer 422 may be made of a same material as the top insulation layer 412, and the bottom insulation layer 422 may be made of a different material from the top insulation layer 412. In this embodiment, the bottom insulation layer 422 is made of a different material from the top insulation layer 412. An interface layer of the shallow trench isolation structure in the array region 101 is further increased through a multilayer structure, which helps improve dielectric properties of the shallow trench isolation structure in the array region 101. Moreover, in this embodiment, the bottom insulation layer 422 is made of a same material as the bottom isolation layer 421.

Specifically, the bottom insulation layer 422 is made of at least one or more of silicon oxynitride, silicon oxycarbonitride, silicon boron nitride, silicon boron oxynitride and silicon carbide nitride. In this embodiment, the bottom insulation layer 422 has a thickness ranging from 3 nm to 5 nm, which may specifically be 3.5 nm, 4.0 nm or 4.5 nm.

In the third structure, referring to FIG. 5, since the top opening area of the first isolation structure 201 is greater than that of the second isolation structure 202, an aspect ratio of the second groove 302 is greater than that of the first groove 301. A groove with a larger aspect ratio is easier to seal. A second air gap 502 exists between the top insulation layer 412 and the bottom insulation layer 422 that are formed by sealing treatment. With the second insulation structure 402 having the second air gap 502, the dielectric properties of the shallow trench isolation structure in the array region 101 are further improved.

Compared with the related art, the first insulation structure in the peripheral region fills the first groove in the first isolation structure, so as to prevent defects such as leakage at the edge of the shallow trench isolation structure in the peripheral region. In addition, the top isolation layer of the shallow trench isolation structure in the peripheral region is made of a low dielectric constant material, so as to improve an isolation effect of the shallow trench isolation structure in the peripheral region.

A second embodiment of the present disclosure relates to a semiconductor structure. Different from the first embodiment, the second embodiment gives a specific structure of the shallow trench isolation structure and corresponding first and second insulation structures. Dielectric properties of the shallow trench isolation structure can be further improved with the shallow trench isolation structure having a plurality of interface layers.

FIG. 6 to FIG. 10 are schematic structural diagrams of a semiconductor structure according to an embodiment of the present disclosure. The semiconductor structure according to this embodiment is specifically described below.

A semiconductor structure formation method according to this embodiment is described in detail below with reference to the accompanying drawings. The contents the same as or corresponding to those in the first embodiment are not described in detail below.

Figure 6:
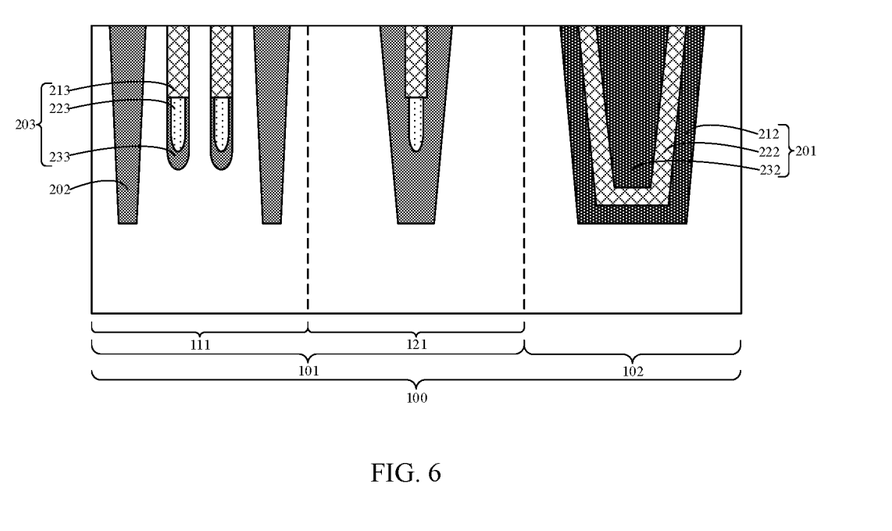
FIG. 6 and FIG. 7 are schematic structural diagrams of a base according to a second embodiment of the present disclosure.

Referring to FIG. 6, the peripheral region 102 includes an isolation groove, the first isolation structure 201 is configured to fill the isolation groove, and the first isolation structure 201 includes a first oxide layer 212, a barrier layer 222 and a second oxide layer 232 sequentially arranged on a sidewall of the isolation groove.

In some embodiments, the first oxide layer 212 is located on a sidewall and a bottom of the isolation groove, the barrier layer 222 is located on a sidewall and a bottom of the first oxide layer 212, and the second oxide layer 232 is located on a sidewall and a bottom of the barrier layer 222. The first oxide layer 212 and the second oxide layer 232 are located on two opposite sides of the barrier layer 222.

In this embodiment, the first oxide layer 212 is made of a same material as the second oxide layer 232, the first oxide layer 212 and the second oxide layer 232 are made of silicon oxide, and the barrier layer 222 is made of silicon nitride. The shallow trench isolation structure in the peripheral region 102 formed through a plurality of insulation layers has a plurality of interface layers, which helps improve dielectric properties of the shallow trench isolation structure in the peripheral region 102.

Figure 7:
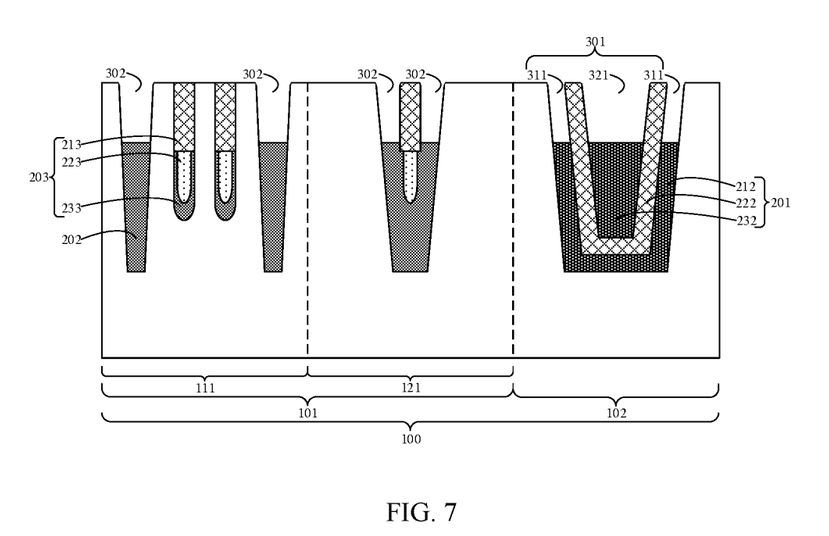

Referring to FIG. 7, a height of a top surface of the first oxide layer 212 and a height of a top surface of the second oxide layer 232 are lower than a height of a top surface of the barrier layer 222, the first oxide layer 212, the barrier layer 222 and the base 100 define a first opening 311, the barrier layer 222 and the second oxide layer 232 define a second opening 321, and the first opening 311 and the second opening jointly form the first groove 301.

Figure 8:
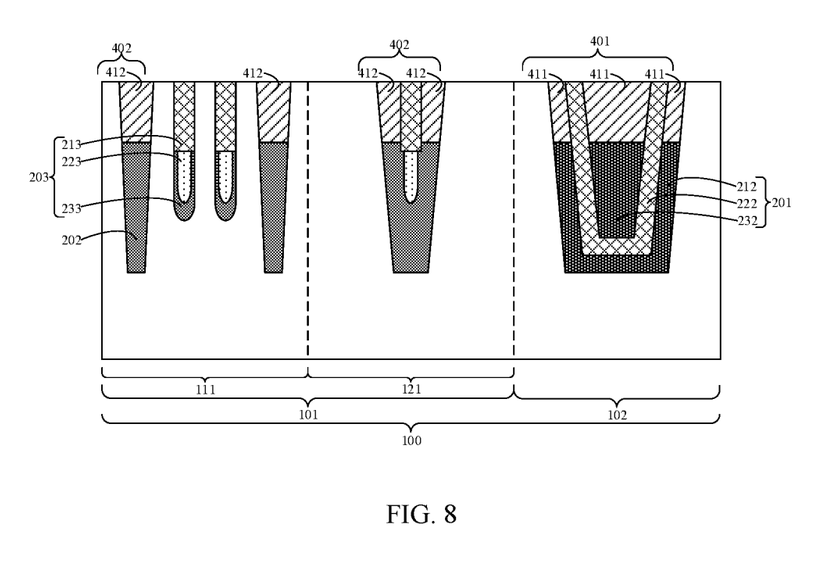
FIG. 8 is a first schematic structural diagram of a semiconductor structure according to the second embodiment of the present disclosure.
Figure 9:
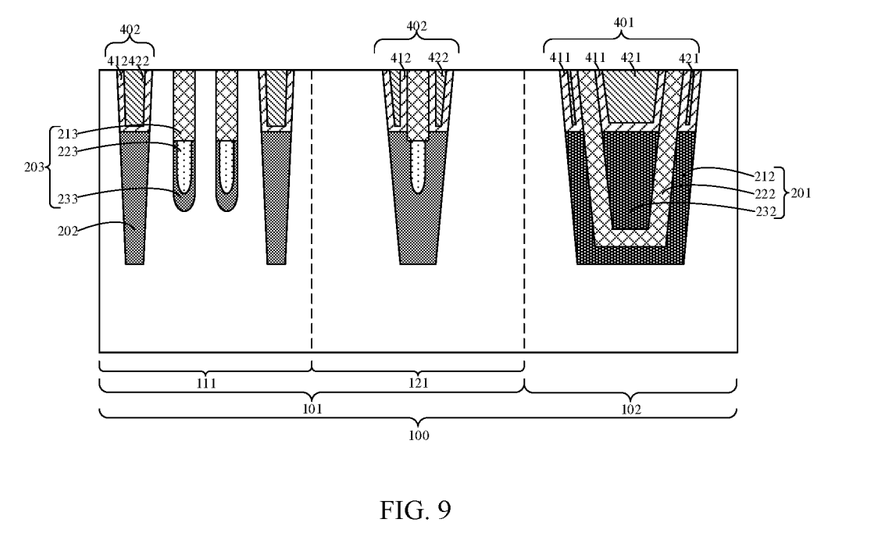
FIG. 9 is a second schematic structural diagram of the semiconductor structure according to the second embodiment of the present disclosure.
Figure 10:
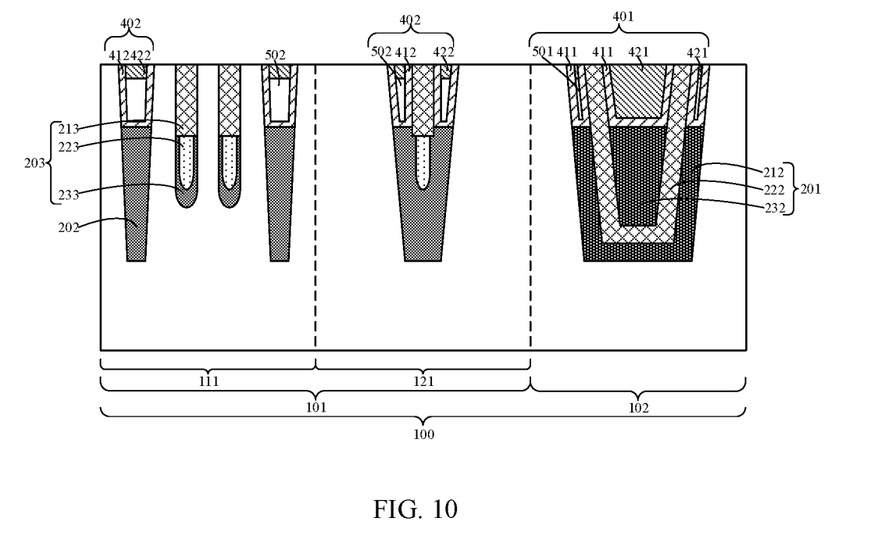
FIG. 10 is a third schematic structural diagram of the semiconductor structure according to the second embodiment of the present disclosure.

Referring to FIG. 8 to FIG. 10, a first insulation structure 401 is configured to fill the first groove 301.

The first insulation structure 401 includes at least a top isolation layer 411, a top surface of the top isolation layer 411 is flush with a top surface of the base 100, and the top isolation layer 411 is made of at least a low dielectric constant material. The top isolation layer 411 is made of the low dielectric constant material, so as to improve an isolation effect of the shallow trench isolation structure in the peripheral region 102.

In some embodiments, the top isolation layer 411 is made of at least one or more of silicon oxynitride, silicon oxycarbonitride, silicon boron nitride, silicon boron oxynitride and silicon carbide nitride. Silicon oxynitride, silicon oxycarbonitride, silicon boron nitride, silicon boron oxynitride and silicon carbide nitride have strong corrosion resistance. The top isolation layer 411 is formed by a low dielectric constant material with strong corrosion resistance to prevent damages to the first insulation structure 401 formed in the subsequent process.

Specific structures of three first insulation structures 401 are given in this embodiment. The three different first insulation structures 401 are specifically introduced below with reference to the accompanying drawings.

In the first structure, referring to FIG. 8, the first insulation structure 401 is of a monolayer structure; that is, the top isolation layer 411 fills the first groove 301 to form the first insulation structure 401.

In the second structure, referring to FIG. 9, the first insulation structure 401 further includes a bottom isolation layer 421; the bottom isolation layer 421 is located on a top surface of the first groove 301 and located on a bottom surface of the top isolation layer 411.

In some embodiments, the bottom isolation layer 421 is located on a sidewall and a top surface of the first groove 301, and the top isolation layer 411 is configured to fill the remaining first groove 301 covered by the bottom isolation layer 421.

The bottom isolation layer 421 may be made of a same material as the top isolation layer 411, and the bottom isolation layer 421 may be made of a different material from the top isolation layer 411. In this embodiment, the bottom isolation layer 421 is made of a different material from the top isolation layer 411. An interface layer of the shallow trench isolation structure in the peripheral region 102 is further increased through a multilayer structure, which helps improve the dielectric properties of the shallow trench isolation structure in the peripheral region 102.

In some embodiments, the bottom isolation layer 421 is made of at least one or more of silicon oxynitride, silicon oxycarbonitride, silicon boron nitride, silicon boron oxynitride and silicon carbide nitride. In this embodiment, the bottom isolation layer 421 has a thickness ranging from 3 nm to 5 nm, which may specifically be 3.5 nm, 4.0 nm or 4.5 nm.

In the third structure, referring to FIG. 10, the first groove 301 is divided into a first opening 311 and a second opening 321. As a result, the first opening has a larger aspect ratio. In the first opening 311, a first air gap 501 exists between the top isolation layer 411 and the bottom isolation layer 421. With the first insulation structure 401 having the first air gap 501, the dielectric properties of the shallow trench isolation structure in the peripheral region 102 are further improved.

Specific structures of three second insulation structures 402 are given in this embodiment. The three different second insulation structures 402 are specifically introduced below with reference to the accompanying drawings.

In the first structure, referring to FIG. 8, the second insulation structure 402 is of a monolayer structure; that is, the top insulation layer 412 fills the second groove 302 to form the second insulation structure 402.

In the second structure, referring to FIG. 9, the second insulation structure 402 further includes a bottom insulation layer 422; the bottom insulation layer 422 is located on a top surface of the second groove 302 and located on a bottom surface of the top insulation layer 412.

In some embodiments, the bottom insulation layer 422 is located on a sidewall and a top surface of the second groove 302, and the top insulation layer 412 is configured to fill the remaining second groove 302 covered by the bottom insulation layer 422.

The bottom insulation layer 422 may be made of a same material as the top insulation layer 412, and the bottom insulation layer 422 may be made of a different material from the top insulation layer 412. In this embodiment, the bottom insulation layer 422 is made of a different material from the top insulation layer 412. An interface layer of the shallow trench isolation structure in the array region 101 is further increased through a multilayer structure, which helps improve dielectric properties of the shallow trench isolation structure in the array region 101. In this embodiment, the bottom insulation layer 422 is made of a same material as the bottom isolation layer 421.

In some embodiments, the bottom insulation layer 422 is made of at least one or more of silicon oxynitride, silicon oxycarbonitride, silicon boron nitride, silicon boron oxynitride and silicon carbide nitride. In this embodiment, the bottom insulation layer 422 has a thickness ranging from 3 nm to 5 nm, which may specifically be 3.5 nm, 4.0 nm or 4.5 nm.

In the third structure, referring to FIG. 10, since the top opening area of the first isolation structure 201 is greater than that of the second isolation structure 202, an aspect ratio of the second groove 302 is greater than that of the first groove 301. A groove with a larger aspect ratio is easier to seal. A second air gap 502 exists between the top insulation layer 412 and the bottom insulation layer 422 that are formed by sealing treatment. With the second insulation structure 402 having the second air gap 502, the dielectric properties of the shallow trench isolation structure in the array region 101 are further improved.

Compared with the related art, the first insulation structure in the peripheral region fills the first groove in the first isolation structure, so as to prevent defects such as leakage at the edge of the shallow trench isolation structure in the peripheral region. In an exemplary embodiment, the top isolation layer of the shallow trench isolation structure in the peripheral region is made of a low dielectric constant material, so as to improve an isolation effect of the shallow trench isolation structure in the peripheral region.

Since the first embodiment is corresponding to this embodiment, this embodiment can collaborate with the first embodiment for implementation. Related technical details described in the first embodiment are still valid in this embodiment, and technical effects that can be achieved in the first embodiment may also be achieved in this embodiment, and are not described herein to avoid repetition. Correspondingly, related technical details described in this embodiment may also be applied to the first embodiment.

A third embodiment of the present disclosure relates to a semiconductor structure formation method.

The semiconductor structure formation method includes: providing a base, the base including an array region and a peripheral region, the peripheral region having a first isolation structure, the array region having a second isolation structure, a top opening area of the first isolation structure being greater than that of the second isolation structure; removing the first isolation structure with a partial thickness to form a first groove in the peripheral region; and forming a first insulation structure filling the first groove, the first insulation structure including at least a top isolation layer, a top surface of the top isolation layer being flush with a top surface of the base, and the top isolation layer being made of at least a low dielectric constant material.

It is to be noted that, in this embodiment, the step of removing the second isolation structure with a partial thickness to form a second groove in the array region is performed simultaneously with the step of removing the first isolation structure with a partial thickness to form a first groove in the peripheral region. The formation efficiency of a shallow trench isolation structure is improved by simultaneously forming the first insulation structure and the second insulation structure. In other embodiments, the first insulation structure and the second insulation structure may also be formed through different steps. This embodiment does not limit a sequence of formation of the first insulation structure and the second insulation structure.

Referring to FIG. 6 to FIG. 10, the semiconductor structure formation method according to this embodiment is described in detail below with reference to the accompanying drawings. The contents the same as or corresponding to those in the first embodiment and the second embodiment are not described in detail below.

Referring to FIG. 6, a base 100 is provided. The base 100 includes an array region 101 and a peripheral region 102. The peripheral region 102 has a first isolation structure 201, and the array region 101 has a second isolation structure 202. A top opening area of the first isolation structure 201 is greater than that of the second isolation structure 202.

The base 100 may be made of sapphire, silicon, silicon carbide, gallium arsenide, aluminum nitride, zinc oxide or the like. In this embodiment, the base 100 is made of a silicon material. It is clear to those skilled in the art that the base 100 being made of the silicon material in this embodiment is intended to facilitate those skilled in the art to understand the semiconductor structure according to this embodiment, which does not constitute a limitation on this embodiment. During an actual application, a suitable base material may be selected as needed.

In some embodiments, the peripheral region 102 includes an isolation groove, the first isolation structure 201 is configured to fill the isolation groove, and the first isolation structure 201 includes a first oxide layer 212, a barrier layer 222 and a second oxide layer 232 sequentially arranged on a sidewall of the isolation groove.

The first oxide layer 212 is located on a sidewall and a bottom of the isolation groove, the barrier layer 222 is located on a sidewall and a bottom of the first oxide layer 212, and the second oxide layer 232 is located on a sidewall and a bottom of the barrier layer 222. The first oxide layer 212 and the second oxide layer 232 are located on two opposite sides of the barrier layer 222.

The first oxide layer 212 is made of a same material as the second oxide layer 232, the first oxide layer 212 and the second oxide layer 232 are made of silicon oxide, and the barrier layer 222 is made of silicon nitride. The shallow trench isolation structure in the peripheral region 102 formed through a plurality of isolation layers has a plurality of interface layers, which helps improve dielectric properties of the shallow trench isolation structure in the peripheral region 102.

Referring to FIG. 7, the first isolation structure 201 with a partial thickness is removed to form a first groove 301 in the peripheral region 102, and at the same time, the second isolation structure 202 with a partial thickness is removed to form a second groove 302 in the array region 101.

In some embodiments, part of the first oxide layer 212 and the second oxide layer 232 and part of the second isolation structure 202 are removed by wet etching to form the first groove 301 located in the peripheral region 102 and the second groove 302 located in the array region 101 respectively. In this embodiment, an etching solution used in wet etching is a hydrogen fluoride solution, and a concentration ratio of hydrogen fluoride to water in the hydrogen fluoride solution ranges from 1:50 to 1:150, which is, for example, 1:75, 1:100 or 1:125. An etching time for wet etching ranges from 30 s to 100 s, which is, for example, 40 s, 50 s, 60 s, 70 s, 80 s or 90 s.

The formed first groove 301 has a depth ranging from 40 nm to 90 nm, which is, for example, 50 nm, 60 nm, 70 nm or 80 nm. The formed second groove 302 has a depth ranging from 30 nm to 70 nm, which is, for example, 40 nm, 50 nm or 60 nm.

Referring to FIG. 8 to FIG. 10, a first insulation structure 401 filling the first groove 301 is formed. The first insulation structure 401 includes at least a top isolation layer 411, a top surface of the top isolation layer 411 is flush with a top surface of the base 100, and the top isolation layer 411 is made of at least a low dielectric constant material. At the same time, a second insulation structure 402 filling the second groove 302 is formed. The second insulation structure 402 includes at least a top insulation layer 412, a top surface of the top insulation layer 412 is flush with the top surface of the base 100, and the top insulation layer 412 is made of at least a low dielectric constant material.

In some embodiments, three methods of forming the first insulation structure 401 and the second insulation structure 402 are given in this embodiment. The three methods of forming the first insulation structure 401 and the second insulation structure 402 given in this embodiment are described in detail below with reference to the accompanying drawings.

In the first method, referring to FIG. 8, a top dielectric film (not shown) filling the first groove 301 (refer to FIG. 7) and the second groove 302 (refer to FIG. 7) and covering the base 100 is formed. The top dielectric film (not shown) is made of at least one or more of silicon oxynitride, silicon oxycarbonitride, silicon boron nitride, silicon boron oxynitride and silicon carbide nitride. Silicon oxynitride, silicon oxycarbonitride, silicon boron nitride, silicon boron oxynitride and silicon carbide nitride have strong corrosion resistance. The top dielectric film (not shown) is formed by a low dielectric constant material with strong corrosion resistance to prevent damages to the first insulation structure 401 and the second insulation structure 402 formed in the subsequent process.

The top dielectric film (not shown) is etched until the surface of the base 100 is exposed, so as to form the top isolation layer 411 located in the peripheral region 102 and the top insulation layer 412 located in the array region 101.

In one example, the top dielectric film (not shown) is etched by chemical mechanical polishing. The top dielectric film (not shown) is polished by chemical mechanical polishing to form the top isolation layer 411 located in the peripheral region 102 and the top insulation layer 412 located in the array region 101. Chemical mechanical polishing has a higher removal rate compared with an etch process, which helps reduce a process cycle.

The top isolation layer 411 fills the first groove 301 to act as the first isolation structure 201, and the top insulation layer 412 fills the second groove 302 to act as the second isolation structure 202.

In the second method, referring to FIG. 9, a bottom dielectric film (not shown) covering a sidewall and a bottom of the first groove 301, a sidewall and a bottom of the second groove 302 and a top surface of the base 100 is formed, and a top dielectric film (not shown) filling the first groove 301 and the second groove 302 and covering the bottom dielectric film (not shown) is formed. The bottom dielectric film (not shown) and the top dielectric film (not shown) higher than the top surface of the base 100 are etched away, a bottom isolation layer 421 covering the sidewall and the bottom of the first groove 301 is formed, a top isolation layer 411 filling the first groove 301 is formed, and a bottom insulation layer 422 covering the sidewall and the bottom of the second groove 302 and a top insulation layer 412 filling the second groove 302 are formed. An interface layer of the shallow trench isolation structure in the array region 101 and the peripheral region 102 is further increased through a multilayer structure, which helps improve dielectric properties of the shallow trench isolation structure in the array region 101 and the peripheral region 102.

In one example, the bottom dielectric film (not shown) and the top dielectric film (not shown) are etched by chemical mechanical polishing. The bottom dielectric film (not shown) and the top dielectric film (not shown) are polished by chemical mechanical polishing. Chemical mechanical polishing has a higher removal rate compared with an etch process, which helps reduce a process cycle.

The bottom insulation layer 422 may be made of a same material as the top insulation layer 412, and the bottom insulation layer 422 may be made of a different material from the top insulation layer 412. In this embodiment, the bottom insulation layer 422 is made of a different material from the top insulation layer 412.

In some embodiments, the bottom insulation layer 422 is made of at least one or more of silicon oxynitride, silicon oxycarbonitride, silicon boron nitride, silicon boron oxynitride and silicon carbide nitride. In this embodiment, the bottom insulation layer 422 has a thickness ranging from 3 nm to 5 nm, which may specifically be 3.5 nm, 4.0 nm or 4.5 nm.

In the third method, referring to FIG. 10, based on the second method, since the formation of the bottom isolation layer 421 and the bottom insulation layer 422 increases equivalently aspect ratios of the first groove 301 and the second groove 302. A groove with a larger aspect ratio is easier to seal. First sealing treatment is performed on the first groove 301 through the top dielectric film (not shown), and second sealing treatment is performed on the second groove 302, so as to form a top isolation layer 411 and a top insulation layer 412. After the top isolation layer 411 and the top insulation layer 412 are formed, a first air gap 501 exists between the top isolation layer 411 and the bottom isolation layer 421 located in the first opening 311, and a second air gap 502 exists between the top insulation layer 412 and the bottom insulation layer 422. With the first insulation structure 401 having the first air gap 501 and the second insulation structure 402 having the second air gap 502, the dielectric properties of the shallow trench isolation structure in the array region 101 and the peripheral region are further improved.

Compared with the related art, the first insulation structure is formed in the peripheral region to fill the first groove in the first isolation structure, so as to prevent defects such as leakage at the edge of the shallow trench isolation structure formed in the peripheral region. In addition, the top isolation layer of the shallow trench isolation structure in the peripheral region is made of a low dielectric constant material, so as to improve an isolation effect of the shallow trench isolation structure in the peripheral region.

Since the first embodiment and the second embodiment are corresponding to this embodiment, this embodiment can collaborate with the first embodiment and the second embodiment for implementation. Related technical details described in the first embodiment and the second embodiment are still valid in this embodiment, and technical effects that can be achieved in the first embodiment and the second embodiment may also be achieved in this embodiment, and are not described herein to avoid repetition. Correspondingly, related technical details described in this embodiment may also be applied to the first embodiment and the second embodiment.

Division of the steps above is only for ease of description, and during implementation, the steps may be combined into one step or some steps may be split into multiple steps, all of which shall fall within the protection scope of the patent provided that a same logical relationship is included. Insignificant modifications added to or insignificant designs introduced in a procedure without changing the core of the procedure shall fall within the protection scope of the patent.

Those of ordinary skill in the art may understand that the above embodiments are specific embodiments for implementing the present disclosure. However, in practical applications, various changes in forms and details may be made thereto without departing from the spirit and scope of the present disclosure.

What is claimed is:

1. A semiconductor structure, comprising:
   a base comprising an array region and a peripheral region, the peripheral region having a first isolation structure, the array region having a second isolation structure, a top opening area of the first isolation structure being greater than that of the second isolation structure;
   the first isolation structure having a first groove, the first groove being formed by removing the first isolation structure with a partial thickness, and a first insulation structure configured to fill the first groove; and the first insulation structure comprising at least a top isolation layer, a top surface of the top isolation layer being flush with a top surface of the base, and the top isolation layer being made of at least a low dielectric constant material.

2. The semiconductor structure according to claim 1, wherein the top isolation layer is made of at least one or more of silicon oxynitride, silicon oxycarbonitride, silicon boron nitride, silicon boron oxynitride and silicon carbide nitride.

3. The semiconductor structure according to claim 1, wherein
the peripheral region comprises an isolation groove, the first isolation structure is configured to fill the isolation groove, and the first isolation structure comprises a first oxide layer, a barrier layer and a second oxide layer sequentially arranged on a sidewall of the isolation groove;
a height of a top surface of the first oxide layer and a height of a top surface of the second oxide layer are lower than a height of a top surface of the barrier layer;
the first oxide layer, the barrier layer and the base define a first opening;
the barrier layer and the second oxide layer define a second opening; and
the first opening and the second opening jointly form the first groove.

4. The semiconductor structure according to claim 1, wherein the first insulation structure further comprises a bottom isolation layer, the bottom isolation layer being located on a top surface of the first groove and located on a bottom surface of the top isolation layer.

5. The semiconductor structure according to claim 4, wherein the bottom isolation layer and the top isolation layer are made of different materials, and a first air gap exists between the top isolation layer and the bottom isolation layer.

6. The semiconductor structure according to claim 1, wherein the second isolation structure has a second groove, and a second insulation structure configured to fill the second groove; and
the second insulation structure comprises at least a top insulation layer, a top surface of the top insulation layer is flush with the top surface of the base, and the top insulation layer is made of at least a low dielectric constant material.

7. The semiconductor structure according to claim 6, wherein the second insulation structure further comprises a bottom insulation layer, the bottom insulation layer being located on a top surface of the second groove and located on a bottom surface of the top insulation layer.

8. The semiconductor structure according to claim 7, wherein the bottom insulation layer and the top insulation layer are made of different materials, and a second air gap exists between the top insulation layer and the bottom insulation layer.

9. The semiconductor structure according to claim 2, wherein the first insulation structure further comprises a bottom isolation layer, the bottom isolation layer being located on a top surface of the first groove and located on a bottom surface of the top isolation layer.

10. The semiconductor structure according to claim 3, wherein the first insulation structure further comprises a bottom isolation layer, the bottom isolation layer being located on a top surface of the first groove and located on a bottom surface of the top isolation layer.

11. A semiconductor structure manufacturing method, comprising:
providing a base, the base comprising an array region and a peripheral region, the peripheral region having a first isolation structure, the array region having a second isolation structure, a top opening area of the first isolation structure being greater than that of the second isolation structure;
removing the first isolation structure with a partial thickness to form a first groove in the peripheral region; and
forming a first insulation structure filling the first groove, the first insulation structure comprising at least a top isolation layer, a top surface of the top isolation layer being flush with a top surface of the base, and the top isolation layer being made of at least a low dielectric constant material.

12. The semiconductor structure manufacturing method according to claim 11, wherein the step of forming a first insulation structure filling the first groove comprises:
forming a bottom isolation layer covering a sidewall and a bottom of the first groove; and
forming a top isolation layer filling the first groove, the top isolation layer and the bottom isolation layer jointly forming the first insulation structure, and the top isolation layer and the bottom isolation layer being made of different materials.

13. The semiconductor structure manufacturing method according to claim 12, wherein the step of forming a top isolation layer filling the first groove comprises:
performing first sealing treatment on the first groove to form the top isolation layer; and
forming a first air gap between the top isolation layer and the bottom isolation layer after the first sealing treatment.

14. The semiconductor structure manufacturing method according to claim 11, further comprising:
removing the second isolation structure with a partial thickness to form a second groove in the array region; and
forming a second insulation structure filling the second groove, the second insulation structure comprising at least a top insulation layer, a top surface of the top insulation layer being flush with a top surface of the base, and the top insulation layer being made of at least a low dielectric constant material.

15. The semiconductor structure manufacturing method according to claim 14, wherein the step of forming a second insulation structure filling the second groove comprises:
forming a bottom insulation layer covering a sidewall and a bottom of the second groove; and
forming a top insulation layer filling the second groove, the top insulation layer and the bottom insulation layer jointly forming the second insulation structure, and the top insulation layer and the bottom insulation layer being made of different materials.

16. The semiconductor structure manufacturing method according to claim 15, wherein the step of forming a top insulation layer filling the second groove comprises:
performing second sealing treatment on the second groove to form the top insulation layer; and
forming a second air gap between the top insulation layer and the bottom insulation layer after the second sealing treatment.

17. The semiconductor structure manufacturing method according to claim 14, wherein the step of removing the second isolation structure with a partial thickness to form a second groove in the array region is performed simultaneously with the step of removing the first isolation structure with a partial thickness to form a first groove in the peripheral region.

* * * * *